United States Patent
Chen et al.

(10) Patent No.: US 6,421,108 B1
(45) Date of Patent: Jul. 16, 2002

(54) METHOD FOR FABRICATING PASSIVATION LAYER

(75) Inventors: Wei-Shiau Chen, Chin-Men Hsien; Shuenn-Jeng Chen, Tainan Hsien; Tsan-Wen Liu, Chilung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/313,516

(22) Filed: May 17, 1999

(30) Foreign Application Priority Data

Apr. 19, 1999 (TW) .......................... 88106215 A

(51) Int. Cl.[7] .................. G02F 1/1333; H01L 21/00
(52) U.S. Cl. ................... 349/122; 216/39; 438/692
(58) Field of Search ............................ 349/122, 138; 438/692, 720, 424; 216/39, 19

(56) References Cited

U.S. PATENT DOCUMENTS

| 5,849,632 A | * | 12/1998 | Tuttle et al. ................ 438/633 |
| 5,908,672 A | * | 6/1999 | Ryu et al. .................... 427/574 |
| 5,985,765 A | * | 11/1999 | Hsiao et al. ................. 438/694 |
| 6,121,151 A | * | 9/2000 | Chen .......................... 438/692 |
| 6,303,043 B1 | * | 10/2001 | Chen et al. .................. 216/39 |

* cited by examiner

Primary Examiner—William L. Sikes
Assistant Examiner—Dung Nguyen
(74) Attorney, Agent, or Firm—J.C. Patents

(57) ABSTRACT

A method for fabricating a passivation layer and a liquid crystal display. For the fabrication method, a substrate is provided. An oxide layer, a first silicon nitride layer, a spin-on-glass (SOG) layer, and a second silicon nitride layer are sequentially formed over the substrate. The liquid crystal display has a controller, a dielectric layer, a metal layer, an oxide layer, a first silicon nitride layer, a spin-on-glass layer, and a second silicon nitride layer. The dielectric layer is positioned over the controller. A metal layer is positioned over the dielectric layer. An oxide layer is formed over the metal layer. A first silicon nitride layer is formed over the oxide layer. A spin-on-glass (SOG) layer is formed over the first silicon nitride layer. A second silicon nitride layer is formed over the SOG layer.

19 Claims, 4 Drawing Sheets

METHOD FOR FABRICATING PASSIVATION LAYER

CROSS-REFERENCE TO RELATED APPLICATION

This application claims the priority benefit of Taiwan application serial no. 88106215, filed Apr. 19, 1999, the full disclosure of which is incorporated herein by reference.

BACKGROUND OF THE INVENTION

1. Field of the Invention

The invention relates to a semiconductor process. More particularly, the invention relates to a method for fabricating a passivation layer.

2. Description of the Related Art

The application of semiconductors involves many fields. For example, semiconductors are applicable in the field of liquid crystal display (LCD). A type of LCD, which is called a reflection type LCD, comprises a top metal layer of a typical semiconductor substrate as a light reflection layer. The metal layer can be functioned as a mirror to reflect the incident light thereon, so as to generate a virtual image needed for display.

However, a passivation layer, which is often formed to cover the metal layer as a protection thereof, degrades the reflection effect of the metal layer. This degradation including reduction of intensity of the reflected light, and the reflected light therefore has insufficient intensity for generating the desirable virtual image.

Two conventional methods for fabricating the passivation layer are as follows:

1. Sequentially depositing an oxide layer and a silicon nitride layer over a surface metal layer of a semiconductor substrate. The oxide layer and silicon nitride layer constitute a passivation layer to resist moisture and to prevent the metal layer from being scratched. The passivation layer and the semiconductor substrate to be protected are shown as FIG. 1. The substrate comprises an inter-metal dielectric layer (IMD) 10, a titanium nitride/titanium (TiN/Ti) layer 12, and the top metal layer 14. The substrate has an opening 16 that exposes a portion of the IMD 10. The opening 16 is filled up with the passivation layer consisting of the oxide layer 18 and silicon nitride layer 20.

As shown in FIG. 1, the passivation layer does not have a smooth surface, thereby degrading the reflectivity of the top metal layer 14 to only about 30%.

2. Using techniques of spin-on-glass (SOG) and chemical-mechanical polishing the SOG layer to achieve a planarization. As shown in FIG. 2, the passivation layer formed by the method comprises a conformal silicon-rich oxide (SRO) layer 38, a spin-on-glass (SOG) layer 42, a TEOS layer 44, and a silicon nitride layer 46. A substrate, which consists of an IMD 30, a TiN/Ti layer 32 and a top metal layer 34, is covered by the passivation layer. The substrate has an opening 36 that exposes a portion of the IMD 30 but that is filled up by the conformal SRO layer 38 and SOG layer 42. However, the polishing step performed on the SOG layer 42 and stopped on the SRO layer 38 often scratches the SRO layer 38. Therefore, the polishing step degrades the planarization of the passivation layer and reduces the reflectivity of the top metal layer 34.

Even if the polishing step is replaced with an etching back step, the thickness of the SOG layer 42 is not easily controlled. Therefore, the etching back step also fails to accomplish the planarization of the passivation layer and to ensure the reflectance of the top metal layer 34.

SUMMARY OF THE INVENTION

Accordingly, the present invention provides a method for fabricating a passivation layer. A metal layer is provided. An oxide layer is formed on the metal layer, followed by formation of a first silicon nitride layer, a spin-on-glass (SOG) layer, and a second silicon nitride layer over the SOG layer. The passivation layer is formed comprising the oxide layer, the first silicon nitride layer, the SOG layer and the second silicon nitride layer.

The oxide layer has a thickness of about 675 to about 825 angstroms, and is preferably about 750 angstroms thick. The first silicon nitride layer has a thickness of about 576 to about 704 angstroms, and is preferably about 640 angstroms thick. The SOG layer is formed by a coating method with a thickness of about 1010 to about 1310 angstroms, and preferably, about 1160 angstroms. The second silicon nitride layer has a thickness of about 1080 to about 1320 angstroms, and is preferably about 1200 angstroms thick.

Fabricating the passivation layer comprising the oxide layer, first silicon nitride layer, SOG layer, and second silicon nitride layer ensures the high reflectivity of the metal layer.

It is to be understood that both the foregoing general description and the following detailed description are exemplary and explanatory only and are not restrictive of the invention, as claimed.

DESCRIPTION OF THE PREFERRED EMBODIMENTS

A method for fabricating a passivation layer comprises the steps of providing a substrate and sequentially forming an oxide layer, a first silicon nitride layer, a spin-on-glass (SOG) layer, and a second silicon nitride layer over the substrate. A detailed description is introduced as follows.

Figure 1:
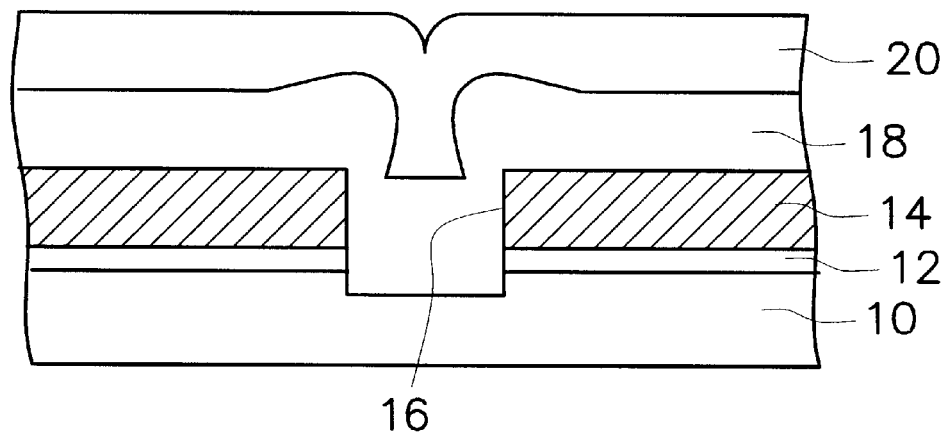
FIG. 1 is a schematic, cross-sectional view of a conventional passivation layer.
Figure 2:
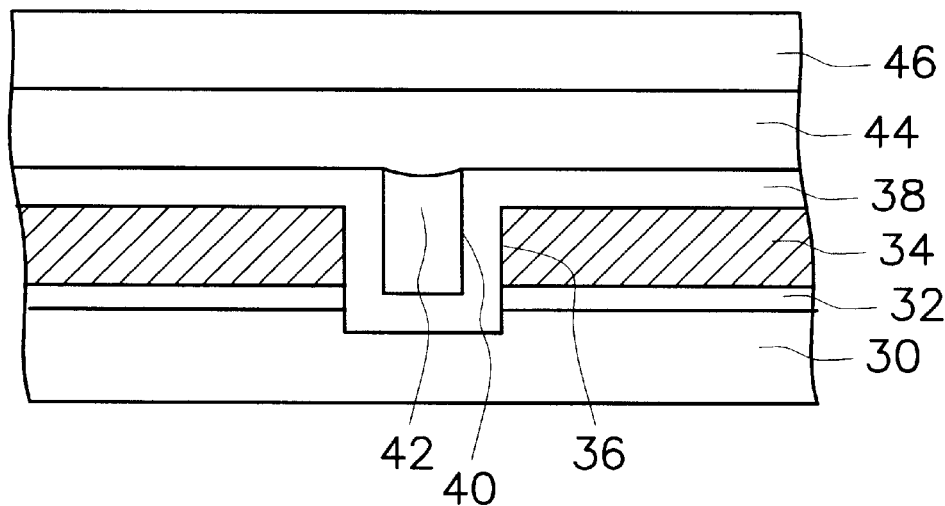
FIG. 2 is another schematic, cross-sectional view of a conventional passivation layer.
Figure 3A:
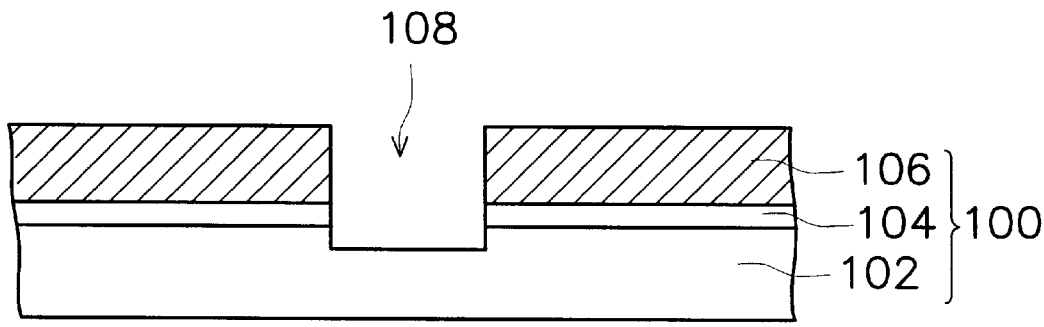
FIGS. 3A–3E are schematic, cross-sectional views for illustrating steps taken in the process for fabricating a passivation layer in accordance with the present invention.

As shown in FIG. 3A, a substrate 100 comprising a top metal layer 106 is provided. Preferably, the substrate 100 further comprises an inter-metal dielectric layer (IMD) 102 under the top metal layer 106, and a titanium nitride/titanium (TiN/Ti) layer 104 between the IMD 102 and the top metal layer 106. Moreover, the substrate 100 may further comprise an opening 108 that penetrate through the top metal layer 106 and the titanium nitride/titanium layer 104 to expose the IMD 102. Preferably, the bottom of the opening 108 is lower than the TiN/Ti layer 104, that is, the opening 108 may be formed by etching the top metal layer 106, the TiN/Ti layer 104, and an upper part of the IMD layer 102.

Figure 3B:
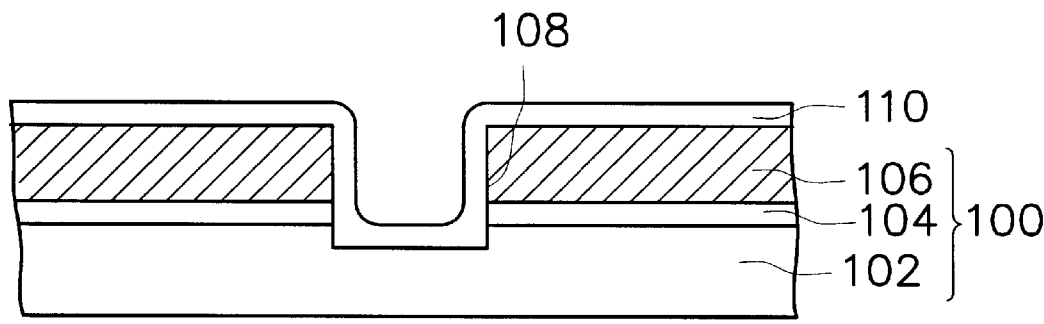

As shown in FIG. 3B, the oxide layer 110 is deposited over the substrate 100, wherein the oxide layer 110 is conformal to a surface profile of the substrate 100. The oxide layer 110 has a thickness of about 675 to about 825 angstroms, and is preferably about 750 angstroms thick.

Figure 3C:
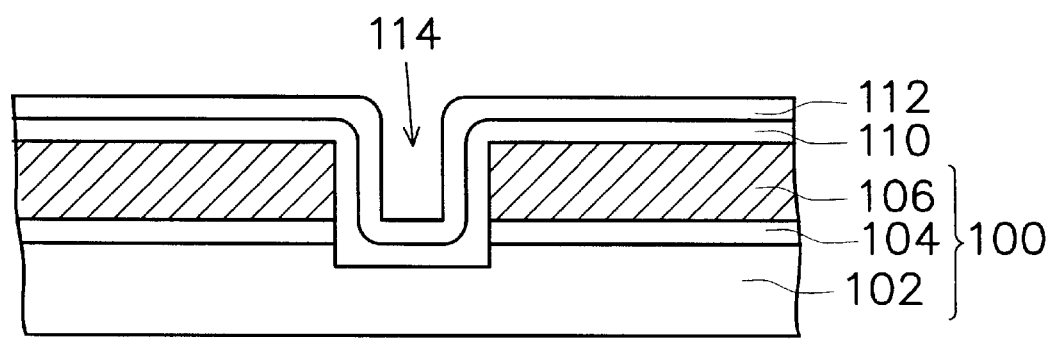

As shown in FIG. 3C, the first silicon nitride layer 112 is deposited over the oxide layer 110, wherein the first silicon nitride layer 112 is conformal to the oxide layer 110. The first silicon nitride layer 112 has a thickness of about 576 to about 704 angstroms, and is preferably about 640 angstroms thick. The first silicon nitride layer 12 has a hollow 114 within the opening (108 shown in FIG. 3B).

Figure 3D:
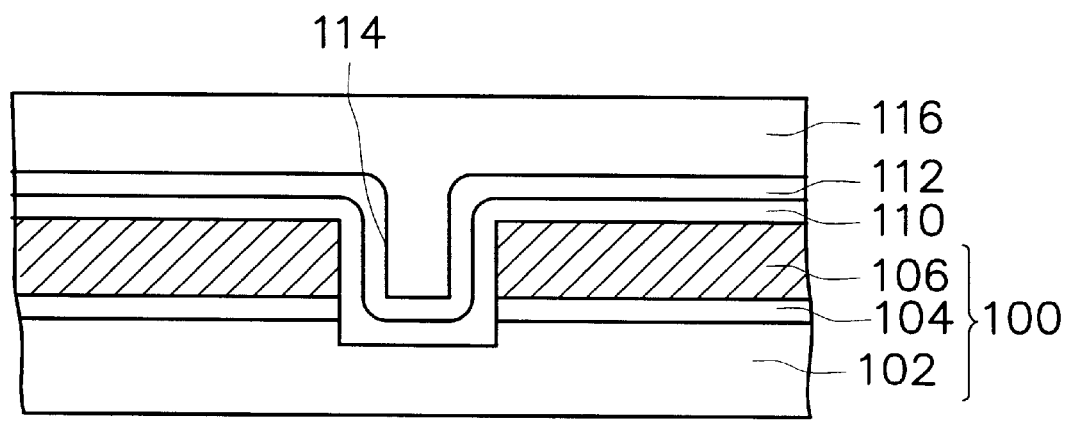

As shown in FIG. 3D, the SOG layer 116 is coated over the first silicon nitride layer 112. The coating step is performed to obtain a planar surface. The SOG layer 116 fills the hollow 114 and covers the first silicon nitride layer 112. The SOG layer 116 has a thickness of about 1010 to about 1310 angstroms, and is preferably about 1160 angstroms thick.

Figure 3E:
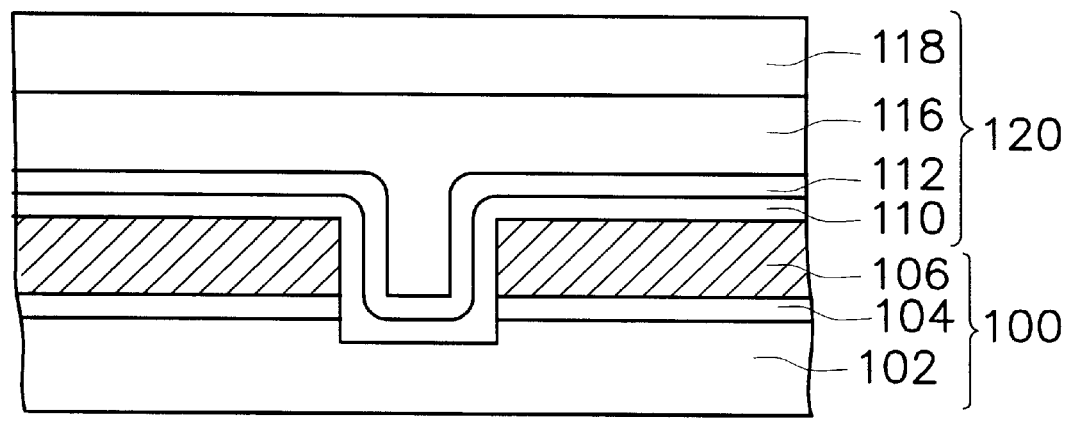

As shown in FIG. 3E, the second silicon nitride layer 118 is deposited over the SOG layer 116. The second silicon nitride layer 118 has a thickness of about 1080 and about 1320 angstroms, and is preferably about 1200 angstroms thick. The silicon nitride layers 112, 118, oxide layer 110, and SOG layer 116 are formed to serve as the passivation layer 120.

The deposition of the silicon nitride layers 112, 118 prevents the substrate 100 from being scratched. Whereas, the deposition of the silicon nitride layers 112, 118 and oxide layer 110 improves the moisture resistance of the passivation layer 120.

Moreover, fabricating the passivation layer 120 according to the present method ensures the high reflectivity of the top metal layer 106 under the passivation layer 120. The top metal layer 106 covered by the passivation layer 120 has a high reflectivity of about 90%. The top metal layer 106 with such high reflectivity not only is applicable to a reflection type liquid crystal display (LCD), but also especially to a reflection type micro LCD ($\mu$-LCD). Such LCD generates a virtual image by reflecting the incident light thereon, so it is therefore used in many types of reflecting instruments employing a virtual image technique.

Figure 4:
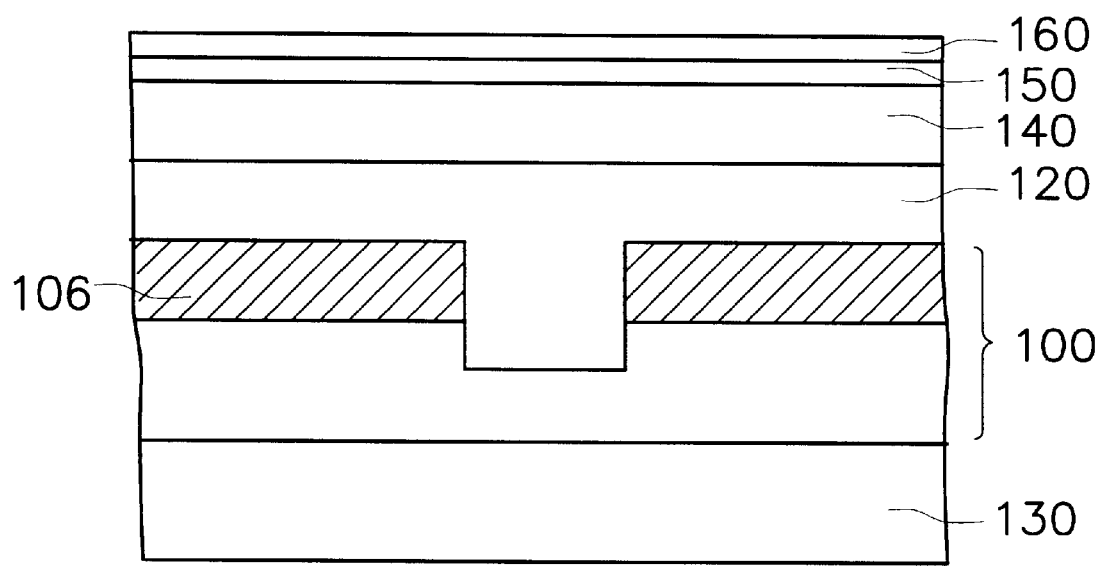
FIG. 4 is a schematic, cross-sectional view of a LCD in accordance with the present invention.

A LCD according to the present invention is schematically plotted in FIG. 4. The LCD has the above-described substrate 100 and passivation layer 120 mounted on a controller 130. The LCD further comprises a liquid crystal (LC) layer 140, a panel 150 and a filter 160 sequentially positioned over the passivation layer 120. The substrate 100 of the LCD has a top metal layer 106 that reflects the light emitted into the LCD. The top metal layer 106, which is covered by the passivation layer 120, liquid crystal (LC) layer 140, panel 150 and filter 160, has still a high reflectivity of at least 20%.

The previously described versions of the present invention have many advantages as follows:
1. Coating the SOG layer is simpler than chemical-mechanical polishing or etching back for effectively producing a planar surface.
2. The SOG layer is formed without the etching back that often degrades the planarization of the passivation layer.
3. Forming the SOG layer by coating easily controls the thickness of SOG layer. The thickness error is only about $10^1$ to $10^2$ angstroms. Note that a uniform thickness facilitates a higher light-reflectance of the top metal layer.
4. Fabricating the passivation layer according to the present method ensures a high reflectance of the top metal layer. The top metal layer covered by the passivation has a high reflectance of about 90%.
5. The present method is applicable to processes for making $\mu$-LCD products.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a passivation layer, comprising:

providing a metal layer having an opening penetrating through the metal layer;

forming an oxide layer over the metal layer;

forming a first silicon nitride layer conformal to a surface profile of the oxide layer and having a hollow over the opening;

coating a spin-on-glass (SOG) layer to cover the first silicon nitride layer and fill the opening; and forming a second silicon nitride layer over the SOG layer.

2. The method of claim 1, wherein the SOG layer has a thickness of about 1010 to about 1310 angstroms.

3. The method of claim 2, wherein the SOG layer has a thickness of about 1160 angstroms.

4. The method of claim 1, wherein the oxide layer has a thickness of about 675 to about 825 angstroms.

5. The method of claim 4, wherein the oxide layer has a thickness of about 750 angstroms.

6. The method of claim 1, wherein the first silicon nitride layer has a thickness of about 576 to about 704 angstroms.

7. The method of claim 6, wherein the first silicon nitride layer has a thickness of about 640 angstroms.

8. The method of claim 1, wherein the second silicon nitride layer has a thickness of about 1080 to about 1320 angstroms.

9. The method of claim 1, wherein the second silicon nitride layer has a thickness of about 1200 angstroms.

10. The method of claim 1, wherein the metal layer is provided over a dielectric layer.

11. The method of claim 10, wherein the opening of the metal layer exposes the dielectric layer.

12. The method of claim 1, wherein the oxide layer is conformal to surface profile of the metal layer.

13. A method for fabricating a passivation layer, comprising:

providing a metal layer having an opening;

forming an oxide layer over the metal layer, wherein the oxide layer is conformal to a surface profile of the metal layer;

forming a first silicon nitride layer over the oxide layer, wherein the first silicon nitride layer is conformal to the oxide layer and has a hollow over the opening;

coating a spin-on-glass (SOG) layer over the first silicon nitride layer; and forming a second silicon nitride layer over the SOG layer.

14. The method of claim 13, wherein the SOG layer is coated to fill the opening and to cover the first silicon nitride layer.

15. A liquid crystal display, comprising a controller;

a dielectric layer, positioned over the controller;

a metal layer, positioned over the dielectric layer, wherein an opening penetrates through the metal layer;

an oxide layer, formed conformal to a surface profile of the metal layer;

a first silicon nitride layer, formed conformal to a surface profile of the oxide layer, wherein a hollow is formed over the opening;

a spin-on-glass (SOG) layer, covering the first nitride layer and filling the opening;

a second silicon nitride layer, formed on the SOG layer.

16. The liquid crystal display of claim 15, wherein the SOG layer has a thickness of about 1010 to about 1310 angstroms.

17. The liquid crystal display of claim 15, wherein the oxide layer has a thickness of about 675 to about 825 angstroms.

18. The liquid crystal display of claim 15, wherein the first silicon nitride layer has a thickness of about 576 to about 704 angstroms.

19. The liquid crystal display of claim 15, wherein the second silicon nitride layer has a thickness of about 1080 to about 1320 angstroms.

* * * * *